United States Patent [19]

Scott

[11] 4,320,390
[45] Mar. 16, 1982

[54] HIGH RESOLUTION ANALOG TO DIGITAL CONVERTER

[75] Inventor: Larkin B. Scott, Fort Worth, Tex.

[73] Assignee: The Perkin-Elmer Corporation, Norwalk, Conn.

[21] Appl. No.: 922,147

[22] Filed: Jul. 5, 1978

[51] Int. Cl.³ .......................................... H03K 13/02
[52] U.S. Cl. ........................ 340/347 NT; 324/99 D; 340/347 AD; 340/347 M; 364/832
[58] Field of Search .... 340/347 M, 347 NT, 347 AD; 324/99 D; 364/832

[56] References Cited

U.S. PATENT DOCUMENTS

| | | | |
|---|---|---|---|
| 3,267,458 | 8/1966 | Anderson et al. | 340/347 NT |
| 3,322,942 | 5/1967 | Gerard et al. | 364/832 X |
| 3,662,376 | 5/1972 | Furukawa et al. | 340/347 AD |
| 3,731,302 | 5/1973 | Neer | 340/347 AD |
| 4,143,362 | 3/1979 | Ulmer | 340/347 NT |
| 4,196,419 | 4/1980 | Brown | 340/347 AD |

FOREIGN PATENT DOCUMENTS 1154795  6/1969  United Kingdom ........ 340/347 AD

OTHER PUBLICATIONS

Landee et al., Electronic Designer's Handbook, McGraw-Hill Book Co., Inc., 1957, pp. 19-13 to 19-15, pp. 23-31 to 23-32.
Anon., Cmos Converter With Charge Balancing, Dec. 9, 1975, New Electronics, vol. 8, No. 24, pp. 30, 31.
Landsburg, A Charge-Balancing Monolithic A/D Converter, IEEE Journal of Solid-State Circuits, vol. SC-12, No. 6, 12/1977, pp. 662-673.
Croisier, Analog to Digital Converter, IBM Technical Disclosure Bulletin, vol. 13, No. 8, 1/1971, pp. 2347, 2348.
The Engineering Staff of Analog Devices, Inc., Analog-Digital Conversion Handbook, 1972, pp. 1-19 to 23; II-46 to 48; II-80 & 81.
Hoeschele, Analog-to-Digital/Digital-to-Analog Conversion Techniques, John Wiley & Sons, Inc., 1968, pp. 356 & 357.

Primary Examiner—Thomas J. Sloyan
Attorney, Agent, or Firm—S. A. Giarratana; E. T. Grimes; J. D. Crane

[57] ABSTRACT

The disclosed high resolution analog to digital converter circuit has an integrator circuit responsive to the unknown analog input. The integrator circuit is operated for a fixed period of time during which, on a periodic basis, a predetermined charge is dumped from the integrator circuit capacitor. A counter is incremented each time a dump occurs and the counter value at the end of the fixed period is related to the high order digits of the digital value for the unknown analog signal. A digital number corresponding to the output level of the integrator is determined by a successive approximation circuit both before and just after the fixed period. The difference between the two values determined by the successive approximation circuit is related to the low order digits of the digital value for the unknown analog signal.

8 Claims, 6 Drawing Figures

| ADDRESS | CONTENT | ADDRESS | CONTENT | ADDRESS | CONTENT |
|---------|---------|---------|---------|---------|---------|
| 0000 | 8D02 | 0047 | 8D04 | 0090 | 8680 |
| 0002 | 20FC | 0049 | B702CF | 0092 | 16 |
| 0004 | CE000D | 004C | 39 | 0093 | 43 |
| 0007 | BDE07E | 004D | 4444 | 0094 | B7020F |
| 000A | 7E00D0 | 004F | 4444 | 0097 | 43 |
| 000D | 0D0A00 | 0051 | 7F0018 | 0098 | 54 |
| 0010 | 002320 | 0054 | 840F | 0099 | 270B |
| 0013 | 04 | 0056 | 8A20 | 009B | 7D028F |
| 0014 | 0000 | 0058 | 9719 | 009E | 2A03 |
| 0016 | 0000 | 005A | DE18 | 00A0 | 10 |
| 0018 | 0000 | 005C | A600 | 00A1 | 20F0 |
| 001A | 0000 | 005E | 39 | 00A3 | 1B |
| 001C | 0000 | 005F | 00 | 00A4 | 20ED |
| 001E | 0000 | 0060 | C603 | 00A6 | 7D028F |
| 0020 | D750B5 | 0062 | B6029F | 00A9 | 2A01 |
| 0023 | F172E3 | 0065 | B7027F | 00AB | 48 |
| 0026 | F377E6 | 0068 | B7026F | 00AC | 39 |
| 002C | 87F4A7 | 006B | B7025F | 00AD | 39 |
| 002F | 27 | 006E | 4848 | 00B0 | BD0090 |
| 0030 | 961D | 0070 | 4848 | 00B3 | 36 |
| 0032 | 8D12 | 0072 | 8A0F | 00B4 | BD0090 |
| 0034 | B702FF | 0074 | 48 | 00B7 | 16 |
| 0037 | 961D | 0075 | 79001D | 00B8 | 32 |
| 0039 | 8D12 | 0078 | 79001C | 00B9 | 1B |
| 003B | B702EF | 007B | 850F | 00BA | 46 |
| 003E | 961C | 007D | 26F5 | 00BB | 2401 |
| 0040 | 8D0F | 007F | 5A | 00BD | 4C |
| 0042 | B702DF | 0080 | 26E0 | 00BE | 39 |
| 0045 | 961C | 0082 | 39 | 00D0 | CE0257 |

*FIG. 5A*

| ADDRESS | CONTENT | ADDRESS | CONTENT | ADDRESS | CONTENT |
|---|---|---|---|---|---|
| 00D3 | 8610 | 0106 | 971E | 0141 | C604 |
| 00D5 | B7022F | 0108 | C606 | 0143 | 6415 |
| 00D8 | BD0090 | 010A | 681E | 0145 | 6616 |
| 00DB | 36 | 010C | 691D | 0147 | 6617 |
| 00DC | 8640 | 010E | 591C | 0149 | 5A |
| 00DE | B7020F | 0110 | 5A | 014A | 26F7 |
| 00E1 | 8680 | 0111 | 26F7 | 014C | D617 |
| 00E3 | B7022F | 0113 | BD0030 | 014E | D71D |
| 00E6 | BC0000 | 0116 | 7E0000 | 0150 | D616 |
| 00E9 | 8600 | 0120 | D617 | 0152 | D71C |
| 00EB | 09 | 0122 | DB1D | 0154 | DF16 |
| 00EC | 26FB | 0124 | D717 | 0156 | BD0030 |
| 00EE | B7022F | 0126 | D616 | 0159 | 39 |
| 00F1 | AD90 | 0128 | D91C | 0160 | D6BF |
| 00F3 | 36 | 012A | D716 | 0162 | 5C |
| 00F4 | AD60 | 012C | D615 | 0163 | D7BF |
| 00F6 | 32 | 012D | C900 | 0165 | C102 |
| 00F7 | 32 | 0130 | D715 | 0167 | 2701 |
| 00F8 | 10 | 0132 | D6BF | 0169 | 39 |
| 00F9 | 48 | 0134 | 5C | 016A | 8620 |
| 00FA | D61D | 0135 | D7BF | 016C | B7022F |
| 00FC | C200 | 0137 | C110 | 016F | 7F00BF |
| 00FE | D71D | 0139 | 2701 | 0172 | BD0030 |
| 0100 | D61C | 013B | 39 | 0175 | 8600 |
| 0102 | C200 | 013C | CE0000 | 0177 | B7022F |
| 0104 | D71C | 013F | 6FBF | 017A | 39 |

FIG. 5B

HIGH RESOLUTION ANALOG TO DIGITAL CONVERTER

BACKGROUND OF THE INVENTION

The present invention relates generally to the field of analog to digital converters and more particularly to an analog to digital converter which can provide high resolution in a very short sampling period.

In the field of scanning spectrophotometers, a field in which the present invention is particularly useful, the output of a photomultiplier tube is measured periodically during a sampling period of approximately 6 milliseconds. As a consequence, the circuitry for measuring the analog output of the photomultiplier tube must respond very quickly.

In the field of analog to digital converters, numerous circuits have been developed for converting an unknown analog signal into a digital representation for the magnitude of the analog signal. One type of analog to digital (A/D) circuit is found in typical digital electronic meters such as multimeters, voltmeters, ammeters, ohmeters, and the like. Such meters typically have three or four display digits and provide resolution in the range of one part in two thousand. Such circuits are incapable of providing resolution of about one part in 65,000 within a 6 millisecond sample period which is required for the contemplated application of the present invention.

A second type of A/D converter is one where the unknown analog signal is applied to an integrator for a sample period. Periodically, during the sample period, a known charge is dumped from the integrator circuit capacitor. The number of charge dumps during the sample period is correlated to the amplitude of the unknown analog input. This type of A/D converter, however, is not capable of providing the desired resolution for the application contemplated for the present invention because insufficient sample time is available as about 1 microsecond is required for each current dump making possible resolution of about one part in six thousand during a 6 millisecond sample period.

A third type of A/D converter is one wherein a successive approximation circuit is utilized. This approach is useful for applications where the unknown input is constant during the period that the successive approximation is made. For scanning spectrophotometers where the present invention finds application, however, the analog output of the photomultiplier tube (PMT) is not constant through the period of time that the PMT output is available for measurement. Accordingly, successive approximation A/D converters are not usable in the application contemplated for the present invention.

Accordingly, it is the principal objective of the present invention to provide a high resolution analog to digital converter for measuring the magnitude of an unknown analog signal over a very short sampling period of time while concurrently averaging the signal.

It is a further objective of the present invention to provide a high resolution analog to digital converter for measuring the magnitude of an analog signal over a sample time of approximately 6 milliseconds yet providing resolution in the order of one part in 65,536.

It is a further objective of the present invention to provide a high resolution analog to digital converter utilizing a microprocessor and associated circuitry which, in applications such as scanning spectrophotometers, can also be utilized in the instrument itself for purposes other than analog to digital conversion.

It is yet a further objective of the present invention to provide a high resolution analog to digital converter for use in an instrument such as a scanning spectrophotometer utilizing a microprocessor wherein the additional hardware cost for producing the high resolution analog to digital converter is nominal compared to the cost of the remainder of the electronics utilized in the instrument.

BRIEF DESCRIPTION OF THE INVENTION

The present high resolution analog to digital converter (A/D converter) has an integrator circuit into which an unknown analog current is admitted from the analog source being measured. A charge dumping circuit is provided to periodically apply during the sample period a known current pulse being half full scale of the successive approximation circuit and of opposite polarity to the input of the integrator circuit. A counting circuit counts the number of dumps occurring during the sample period. The number of counts is related to the high order digits of the digital number developed by the converter from the unknown analog signal.

For convenience, a successive approximation circuit measures the output of the integrator circuit both before and after the sample period. However, the measurements may be made by other suitable means known in the art. Then, the difference between the integrator circuit output prior to the sample period and that after the sample period is calculated. This difference is related to the low order digits of the digital representation for the unknown analog signal.

BRIEF DESCRIPTION OF THE DRAWINGS

The foregoing and other objects, advantages and features of the present invention are described below in greater detail in connection with the drawings wherein:

FIGS. 5A and 5B show the address and the content of addressable locations in the ROM of FIG. 4.

DETAILED DESCRIPTION

Figure 1:
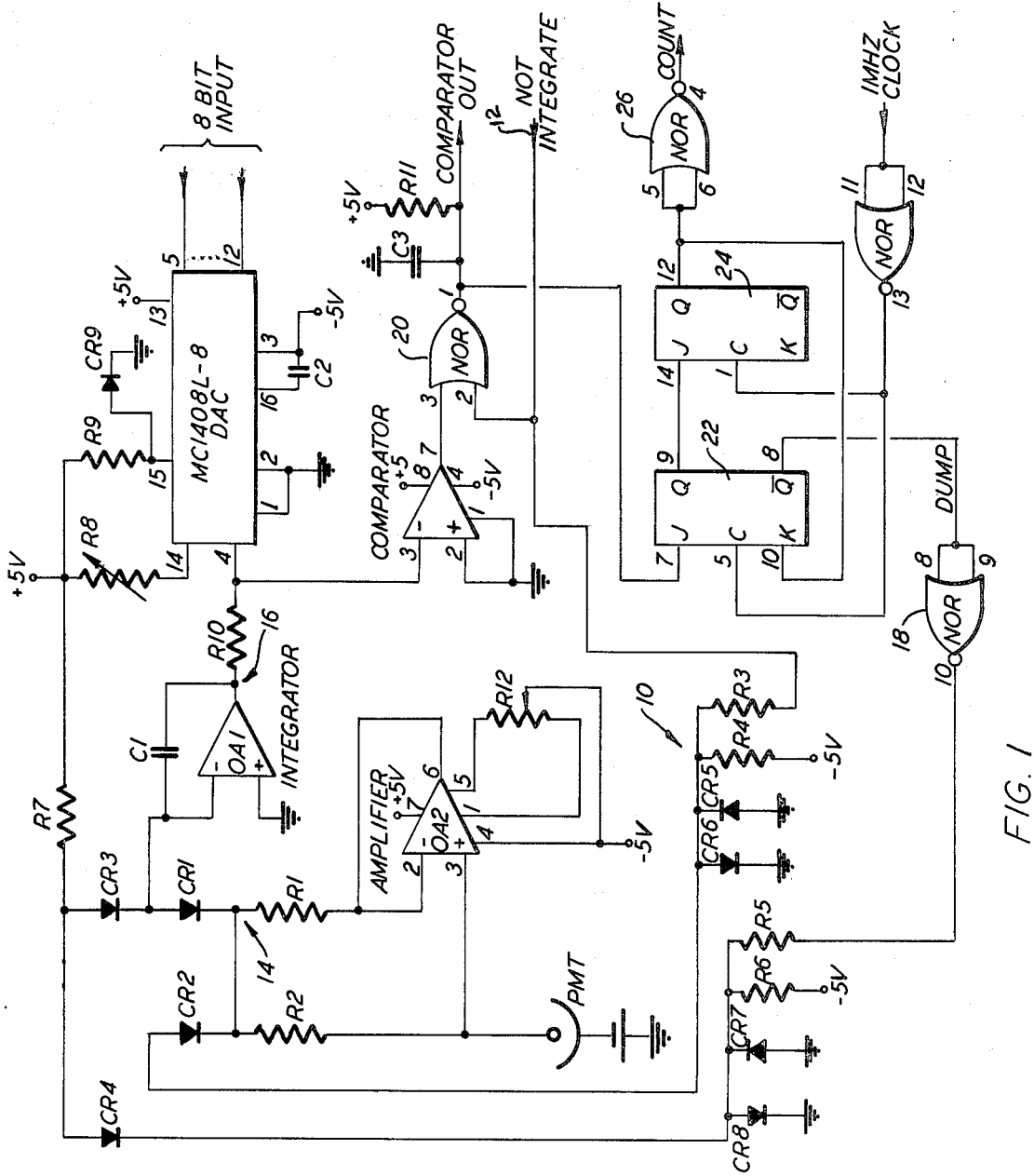
FIG. 1 shows the circuitry of the analog to digital converter which couples to a microprocessor.

Referring first to FIG. 1, a portion of the circuitry for the analog to digital converter (A/D converter) is shown. One principal element of the circuitry of FIG. 1 is a integrator which is made up of an operational amplifier OA1 and a capacitor C1 coupled between the output and the inverting input of the operational amplifier OA1. The inverting input of operational amplifier OA1 is coupled by two diodes CR1 and CR2 to a gate signal generating circuit indicated generally at 10 which comprises two resistors R3 and R4 as well as two further diodes CR5 and CR6. When the NOT INTEGRATE signal is low, it couples through the resistor R3 thereby giving the diode CR2 a slight reverse bias. Accordingly, whenever the NOT INTEGRATE signal is low, a current flowing in the direction indicated by arrow 12 enters the node indicated at 14. The current indicated by the arrow 12 corresponds to a current delivered by a photo-detector such as the photomultiplier tube (PMT) of a spectrophotometer.

In accordance with FIG. 1, the photomultiplier tube PMT is coupled to the non-inverting input of a second operational amplifier OA2 as well as a resistor R2 which couples between the PMT and the node 14. The output of operational amplifier OA2 couples by way of another resistor R1 to the node 14. The operational amplifier OA2 is connected so as to amplify the photomultiplier current depending on the relative values of the resistors R1 and R2.

In operation, whenever the NOT INTEGRATE signal is low, the output of the PMT is amplified by the operational amplifier OA2 in such a manner that the output of the integrator circuit at point 16 comprises a ramp signal whose slope is a function of the amplitude of the current delivered by the PMT. The charge which developes across the capacitor C1 is correlated to the integral of the current flowing from the PMT.

A reverse polarity dump current is admitted to the integrator circuit by way of the resistor R7 and the diode CR3. The dump current is kept away from the integrator circuit, however, when the diode CR4 is forward biased which occurs whenever the dump signal input to the NOR gate 18 is high. The resistors R5 and R6 as well as the diodes CR7 and CR8 provide a level shifting function for the dump signal after it is inverted by the NOR gate 18 so that the signal applied to the diode CR4 is either slightly positive or slightly negative.

The output of the integrator circuit 16 is coupled by a resistor R10 to the current sink pin 4 of a digital to analog converter (DAC) and also to the inverting input of a comparator circuit CMP. During an integration period, the 8 bit input to the DAC is fixed. Accordingly, if the integrator output voltage is low, the current in the resistor R10 is smaller than the current the DAC can sink at pin 4 thereby causing the inverting input to the comparator circuit to be at a level below ground. As the integrator output rises, however, a point is reached when the current in the resistor R10 is equal to that which the DAC can sink at pin 4 whereupon the inverting input to the comparator circuit will begin to rise at a rate equal to that of the integrator output. When the switching level of the comparator CMP is reached, its output will go low which, in combination with the low NOT INTEGRATE signal, will cause the NOR gate 20 to produce a high level which is coupled to the J input of the J-K flip-flop 22. A second J-K flip-flop 24 is coupled to the flip-flop 22 to form a dual J-K flip-flop wich is gated by a 1 MHz clock thereby generating a 2 microsecond low level pulse signal on the line labeled dump which causes the output of NOR gate 18 to go high thereby reverse biasing the diode CR4. When this occurs, the dump current is introduced into the integrator circuit by way of the resistor R7 and the diode CR3 for 2 microseconds. This causes a fixed reduction in the charge on capacitor C1.

The line labeled CMP OUT goes high whenever the comparator circuit indicates that the output of the integrator circuit at 16 has risen sufficiently high that a current dump should occur. This of course occurs whenever the output of the NOR gate 20 goes high which is caused by both its inputs being low.

The Q output of the second J-K flip-flop 24 is coupled by an additional NOR gate 26 to a COUNT line which has a pulse thereon each time a current dump occurs.

As will be indicated by discussion to follow, the NOT INTEGRATE signal is held low by an external circuit not shown in FIG. 1 for a period of time approximately 6 milliseconds which corresponds to the sample period. During this period of time, the unknown output from the PMT is amplified by the operational amplifier OA2 producing a signal at the input to the integrator. Whenever the comparator CMP indicates that a sufficient charge has accumulated on the capacitor C1 of the integrator circuit, the comparator CMP triggers the J-K flop-flops 22 and 24 to produce a 2 microsecond dump signal. The dump signal is transmitted by way of the NOR gate 18, working as an inverter, and the resistor R5 to the diode CR4 which becomes reversed biased. Thereafter, a reverse plurality dump current is introduced into the integrator by way of the resistor R7 and the diode CR3. The number of times this occurs during the period that the NOT INTEGRATE signal is low can be determined by counting the pulses appearing at the output of NOR gate 26. This is accomplished by circuitry shown elsewhere.

In accordance with the operation of the circuitry according to the present invention, in the time period occuring between integration periods (sampling periods), the integrator output is deprived of both the unknown analog signal as well as the dump signal so that its output remains constant. Just prior to and just after any integration period, the circuitry in accordance with the present invention causes an external microprocessor to manipulate the 8 bit input to the DAC partially in response to the output of the comparator circuit CMP in a successive approximation or other suitable evaluation process which means that it arrives at a DAC input number and associated sink current value that most closely balances the current through the resistor R10 due to the output voltage of the integrator. By storing the number correlated to the level of the integrator prior to the sample period and by storing the corresponding number just following the sample period, the microprocessor can develop a difference between these two numbers which corresponds to the difference between the integrator output at 16 at the beginning of a given integration period and the output of the integrator at 16 at the end of that period. This difference can be developed by other suitable techniques such as by using a dual-slope A/D converter to measure the integrator output before as well as after the integration period.

In order for the interpolation scheme using the DAC to work correctly, the resistors R7, R8, R9 and R10, the capacitor C1, and the time duration of the dump pulse must have properly related values. First of all, R9 must have a value approximatey equal to R7. Accordingly, R9 then supplies a current equal to the dump current to the reference diode CR9 which sets up a voltage reference for the current reference input to the DAC by way of resistor R8. In other words, the DAC current reference resistor R8 is made to experience the same voltage drop across it as occurs across R7 during a current dump. Thus a change in dump current due to the temperature characteristic of diode CR3 would be matched by a proportional change in DAC reference current due to a similar characteristic change in diode CR9. This of course assumes that the two diodes track in temperature. In practice, however, these diodes merely need to track within a few degrees of each other due to the relatively low resolution of the interpolation method. Were it not for this compensation scheme made available by the voltage and current reference provisions of the DAC, a more elaborate current source would be needed for diode switching of the dump current.

Next, if the DAC reference current and the dump current are equal (R8 and R7) and the size of one dump corresponds to the full-scale range of the DAC, then it can be shown that the product R10C1 must simply equal the time duration of one dump. However, for the input current scale factor desired, the dump current canot be as large as the minimum reference current needed by the DAC. Furthermore, to avoid completely any edge effects of driving the integrator output over the full-scale range of the DAC, a single dump is already made to correspond as exactly as possible to one-half the full scale for the DAC with each dump being initiated at the three quarter of full scale so that the integrator output excursions cover the middle one-half of the DAC range. The result of these restrictions is that R10C1=2TR8/R7 gives the desired relationship where T is the time duration of the dump. Any one of the components can be trimmed to obtain the desired agreement dictated by the above equation, however, R8 is chosen to be adjustable primarily for reasons of layout and ease of adjustment.

As noted earlier, the DAC has a fixed input during any integration period and it is preferable that the input be a number in the neighborhood of $\frac{3}{4}$ the full scale. In this manner, the range of the integrator output level that can occur is from the $\frac{3}{4}$ full scale level down to about $\frac{1}{4}$ full scale. Admittedly, this practice ignores about half the useful range of the DAC, however, there is still more than needed resolution available and any problems associated with measuring the integrator output level near the limits of the DAC range is avoided.

Figure 3:
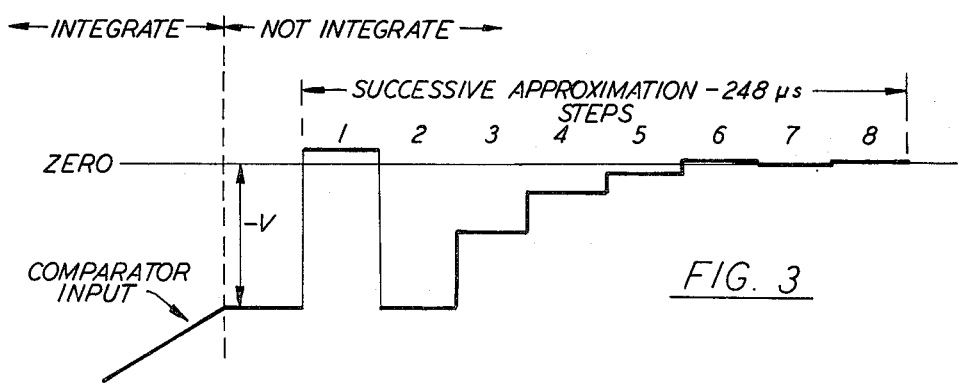
FIG. 3 is a pulse diagram which illustrates, in part, the operation of the successive approximation circuit.

The operation of the successive approximation circuit is explained in connection with FIG. 3 where the process is illustrated for an example where the integrator output level is just barely in excess of 33/64 full scale at the end of the sample period, i.e., when the NOT INTEGRATE signal goes high. At the conclusion of the integration period, the comparator input is at $-V$ volts and remains constant until the DAC is actuated by the microprocessor. At the beginning of any successive approximation routine, the microprocessor causes the DAC to respond to an input of 10000000 binary or, one half full scale as the trial value for the first step. In the present example, the resulting DAC output current combines with the output of the integrator current so that the inverting input to the comparator remains positive causing its output to go low whereby the output of NOR 20 in FIG. 1 goes high which is the level on the CMP OUT line to the microprocessor. When the microprocessor notes a high level on the CMP OUT line this indicates that the trial value belongs in the final number. In the case of the first number tried, namely, 10000000, the one in the most significant bit belongs to the final number.

In the second step, a binary one is inserted into the second most significant bit position which makes the second trial value three quarters full scale or 11000000 binary. When this occurs, as indicated in FIG. 3, the DAC current is too great making the comparator input negative thereby causing its output to go high which in turn causes the CMP OUT line to go low. The microprocessor responds to the low condition on the CMP OUT line by removing the trial bit and storing a zero in the second bit position of the final number, i.e., the first two bits of the final number have been determined to be 10.

This process continues through the third, fourth and fifth steps of the successive approximation. As indicated in FIG. 3, during each of these steps, the comparator input remains negative and, accordingly, a zero is stored in the third, fourth and fifth most significant bits thus indicating the first 5 bits of the final number are 10000. However, in the sixth step, the comparator input goes just slightly positive once more which leads to the storage of a one in the sixth bit position. Finally, during the seventh and eighth trial steps, both result in a very small negative input to the comparator causing a zero to be stored in the seventh and eighth bit positions by the microprocessor. Accordingly, the final number generated by this successive approximation process is 10000100 binary or, 33/64 of the full scale range covered by the eight bit DAC. Those skilled in the art will recognize that the successive approximation circuit operates in a similar manner for other integrator circuit output levels which are measured either before or after a sample period. The measured number is used in a manner described below to partially define the digital number correlated to the PMT output being measured.

The circuit elements of FIG. 1 are identified below in Table 1 for one embodiment of the invention.

TABLE 1

| | | |
|---|---|---|
| R1 20K | R4 4K | FET1 Siliconix M116 |
| R2 1M | R3 1.2K | NOR 74L502 |
| R6 3.3K | R11 1K | J-K 74L573 |
| R5 1.2K | OA1,OA2 RCA 3140 | DAC MC1408L-8 |
| R10 698 | CR1-9 IN3064 | Comparator CMP-01 |
| R8 3929(Adjustable) | C1 .001 | |
| R9,R7 22.1K | C2 500pf | |
| R12 10K(Adjustable) | C4 100pf | |

Figure 2:
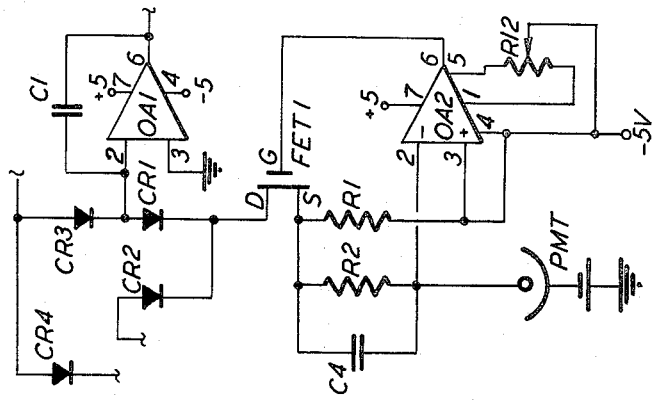
FIG. 2 is a modification of the circuit of FIG. 1.

A modification to the circuit of FIG. 1 suggested by Robin D. Houseman is shown in FIG. 2 which lets the photomultiplier anode sink current at a node that is a virtual $-5$ volts. From an impedance standpoint, this is equivalent to having the anode at virtual ground as is conventional practice whereby stray capacitance has no first order adverse effect. In accomplishing this, the circuit configuration of operational amplifier OA2 is in some respects similar to a conventional current-to-voltage arrangement where feedback occurs via a one megohm resistor R2 tied to the inverting input pin 2 where the photomultiplier anode is also connected. This feedback resistor R2 is driven by the operational amplifier OA2 output pin 6 via a FET working as a source follower. The non-inverting input pin 3 of operational amplifier OA2 is tied to $-5$ volts which becomes the working level of the photomultipier anode due to feedback. The drain of the FET is connected to the relatively more positive input of the integrator via a diode CR1. This current sink by the photomultiplier anode comes from the integrator input via the drain-to-source conductance of the FET. The 20K resistor R1 from the source to $-5$ volts provides an additional and proportionately larger current which accounts for the current amplification action.

Figure 4:
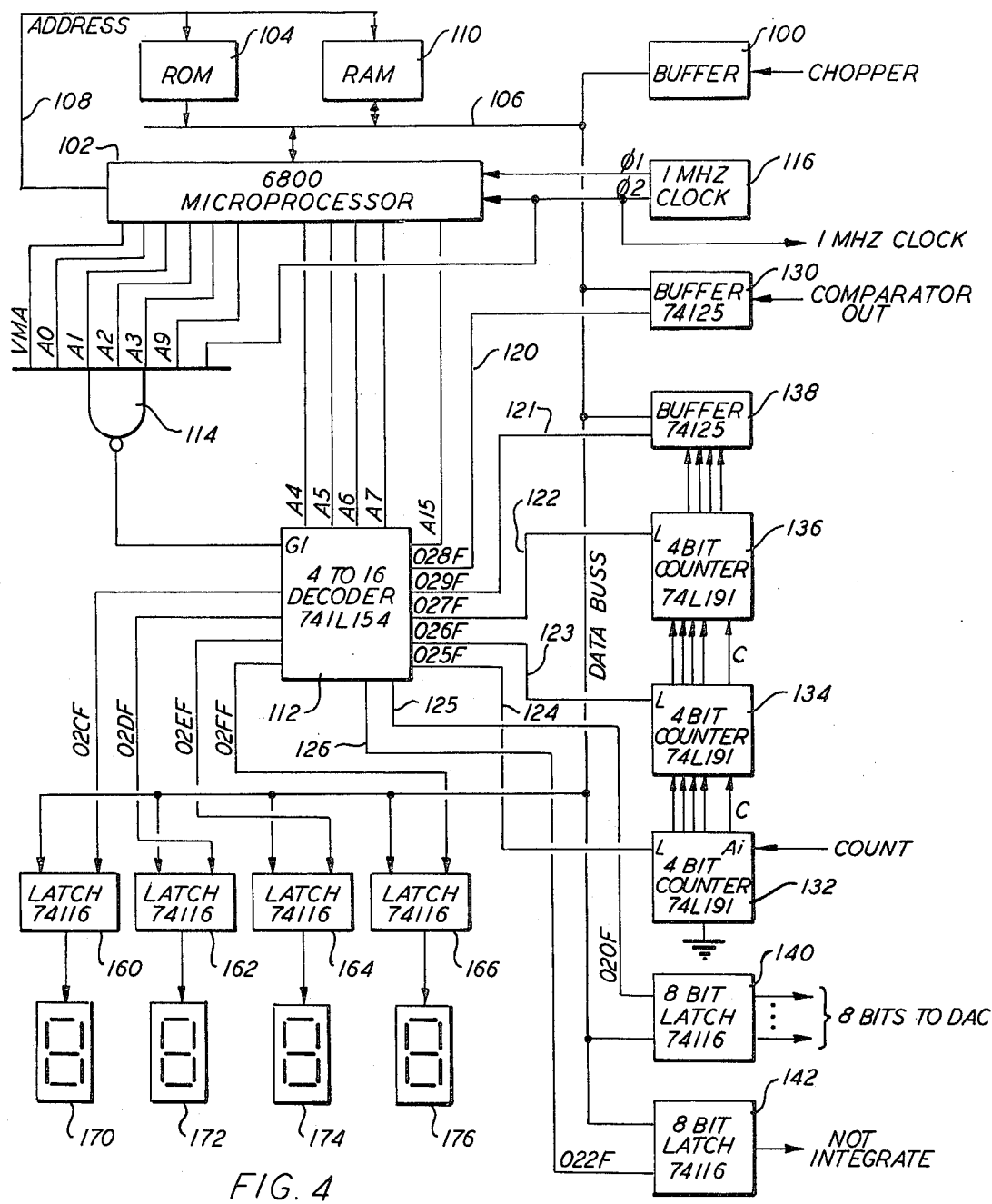
FIG. 4 shows the microprocessor and associated circuitry which couples to the circuitry of FIG. 1 or 2.

Referring now to FIG. 4, one configuration is shown for servicing the hardware of FIGS. 1 or 2 to produce a digital representation of an analog input signal. The circuit includes a chopper input signal which comprises a pulse, from a chopper position sensor (not shown), which is stored in a buffer 100. The pulse itself is generated by any suitable chopper position sensor such as a photoelectric configuration employing, for example, a light emitting diode and a phototransistor. The photosensor arrangement is utilized to detect the position of a typical mechanical chopper used in a spectrophotometer to indicate when the analog to digital converter of the invention is to be actuated. For other applications of the invention, an alternative triggering mechanism may be needed to actuate the analog to digital converter.

The buffer 100 is coupled by a suitable interupt line (not shown) to the Motorola 6800 Microprocessor 102 to cause interupts thereto in a manner well known to users of that particular microprocessor. Those of skill in the art will recognize, however, that the principles of the invention are not limited to utilizing the 6800 Microprocessor but apply equally to other microprocessors. The pulse stored in the buffer 100 causes the microprocessor 102 to be interrupted to thereby initiate the operation by the analog to digital converter according to the invention. An alternative configuration which will be described in greater detail hereinafter has an analog to digital converter according to the invention opperative continuously to provide a continually updated digital representation for the analog signal being measured thereby. In this arrangement, the external triggering is not required in order to start the analog to digital converter.

In its control function for the circuitry shown in FIGS. 1 and 2, the circuitry of FIG. 4 includes a ROM 104 which couples the data therefrom to the microprocessor 102 by way of the data buss 106. The ROM 104 is addressed by the microprocessor 102 over the address bus 108.

In addition, the configuration of FIG. 4 includes a random access memory (RAM) 110 which is addressed by of the address of 108 and places data on the data buss 106. A four to sixteen bit decoder 112 is coupled to specific bit positions on the address bus 108. The gate of the four to sixteen bit decoder 112 is triggered by a seven input NAND gate 114 which is triggered by the valid memory address line (VMA) and phase 2 from the 1 MHz clock 116 as well as address bus bit positions 0, 1, 2, 3 and 9. In addition, address bus position 15 (A15) directly gates the four to sixteen bit decoder 112. This decoder 112 directly decodes address bus positions 4, 5, 6 and 7 (A4, A5, A6 and A7). By properly defining the control sequence specified by the ROM 104, the partial decoding of the address bus by the NAND 114 and the four to sixteen bit decoder 112, the output lines 120, 121, 122, 123, 124, 125 and 126 can be actuated by addresses on the address bus corresponding respectively to 028F, 209F, 027F, 026F, 025F, 020F and 022F. The function of each of these output lines 120-126 will be described hereinafter.

The 1 MHz clock 116 is a two phase clock whose first phase is coupled only to the microprocessor 102 and whose second phase is coupled to the microprocessor 102, the NAND 114 as well as providing the 1 MHz clock signal to the circuitry of FIGS. 1 and 2.

A buffer 130 couples to the comparator out line from the circuit of FIG. 1 to provide dynamic storage of the level of the comparator out line from that circuit. The buffer 130 is coupled to the data buss 106 so that when a signal appears on the line 120, the content of the buffer 130 is placed onto the data buss 106. In this manner, the level of the comparator out line can be sensed by the microprocessor 102 by sensing the data on the data bus at a time when the line 120 is actuated.

As indicated earlier, the count line from the circuitry of FIG. 1 has a pulse thereon each time there is a charge dump from the capacitor of the integrator circuit in FIG. 1. This pulse is transmitted to the counter 132 of FIG. 4. The counter 132 is a four bit binary counter which responds to the count pulses and, whenever it overflows, i.e., the binary counter steps from binary 15 back to binary 0, a carry pulse is produced on the line indicated by the arrow labeled C from the counter 132 to the counter 134. The counter 134 accumulates carry pulses from the counter 132 in the same manner that counter 132 accumulates count pulses from the circuitry from FIG. 1.

A further counter 136 is coupled to counter 134 by way of a carry line indicated by the letter C so that the counter 136 accumulates carry pulses from the counter 134. In this manner, the three counters 132, 134 and 136 are capable of counting up to four thousand ninety six charge dumps occurring at the integrator of FIG. 1 during the integration period although the system as configured herein will not experience that many charge dumps because the remaining circuitry will not generate that fast.

The counter 136 is coupled by a data bus indicated by four parallel arrows to a buffer 138. Whenever the output line 121 from the four to sixteen bit decoder 112 is actuated, the data in the counter 136 is transferred in parallel to the buffer 138. The content of the buffer 138 is placed onto the data buss 106 so that the microprocessor 102 can sense the content of the counter 136 by way of buffer 138.

In a similar manner, counters 134 and 136 are coupled by a data bus. The content of the counter 134 is loaded into the counter 136 whenever the output line 122 is actuated. In like manner, the counter 132 is coupled to counter 134 by a data bus indicated by four parallel arrows so that the data of the data of counter 132 can be loaded into counter 134 whenever the output line 123 is actuated. The load input to the counter 132 is grounded so that when line 124 is actuated, counter 133 is loaded with zeros, i.e., it is cleared.

In addition, the circuitry of FIG. 4 includes an eight bit latch 140 which is coupled to the data buss 106 as well as to the output line 125 from the four to sixteen bit decoder 112. The latch 140 is operative to store the data on the data buss 106 whenever the output line 125 is actuated. The data stored in the latch 140 is transmitted by eight parallel lines to the DAC in FIG. 1 and comprises the input A further eight bit latch 142 is also coupled to the data bus 106 as well as to the four to sixteen bit decoder 112 by way of the output line 126. The latch 142 is operative to store the data on the data bus 106 whenever the output line 126 is actuated. The latch 142 is utilized to produce either a high or low signal on a single output line to the circuitry of FIG. 1 which is labeled "NOT INTEGRATE". By providing a processor timing loop with the ROM 104, the microprocessor 102 can provide a "NOT INTEGRATE" signal from a selected bit position in the latch 142 having a duration of any desired time which is a multiple of the counting loop time within the microprocessor 102. For the control function provided in the ROM 104 in accordance with the present invention which is described in greater detail in FIG. 5, the "NOT INTEGRATE" signal from the latch 142 to the circuitry of FIG. 1 is operative to permit the integrator to function for a period of exactly 6 milliseconds for each time that the analog to digital converter of the invention is actuated.

The circuitry of FIG. 4 has an output circuit comprising four 8 bit latches 160, 162, 164 and 166 which respectively drive 7 segment displays 170, 172, 174 and 176. The decoder 112 can decode addresses 02CF, 02DF, 02EF or 02FF from the address bus 108 which causes data on the data bus to be respectively gated into latches 160, 162, 164 or 166. Consequently, the latches 160, 162, 164 and 166 can be selectively loaded by the microprocessor with whatever data is desired. For the circuit of FIG. 4, the desired data is the digital representation of the unknown analog input signal.

For the control data specified by FIG. 5, the system of FIG. 4 is operative to convert the binary number calculated by the microprocessor 102 into a hexadecimal code for actuating the 7 segment displays 170, 172, 174 and 176. Accordingly, the four 7 segment displays 170, 172, 174 and 176 can display in hexadecimal the 16 bit binary number developed in the microprocessor for the unknown analog input. Those of skill in the art will recognize, however, that a binary to decimal converter could be utilized between the latches 160, 162, 164 and 166 and a decimal display with five 7 segment displays. In this manner, the output can be displayed in decimal.

The ROM 104 is arranged so that the addresses therein have the content as shown in FIG. 5 which controls the hardware shown in FIGS. 4 and 1 in such a manner that the hardware will continuously operate to provide a digital indication for the unknown analog signal which is being measured thereby. The interupt hardware including buffer 100 is not required for this arrangement. In the case of the circuitry shown in FIG. 1, the unknown analog signal comprises the output of the photomultiplier tube "PMT". The control provided by the content indicated in FIG. 5 in summary causes the circuitry in FIGS. 1 and 4 to measure digitally the output of the integrator in FIG. 1 prior to the beginning of the integration period. This digital representation is stored for later processing. Once the initial value of the integrator output has been calculated, the microprocessor 102 actuates the NOT INTEGRATE line by way of the latch 142 so as to cause the integrator of FIG. 1 to start integrating. During the integration period, charge dumps will occur in a manner described earlier causing a pulse to appear on the count line to the circuitry of FIG. 4 from FIG. 1. These pulses on the count line are counted by the counters 132, 134, and 136. At the conclusion of the integration period, the microprocessor 102 changes the level on the NOT INTEGRATE line by way of the latch 142 and proceeds, by successive approximation, to measure the output of the integrator in the circuit of FIG. 1. Once the digital value for the integrator output has been determined, this value is stored for subsequent processing as well.

Following the successive approximation calculation at the conclusion of the integration period, the count stored in the counters 132, 134 and 136 is read into the microprocessor 102 and is utilized thereby to establish the high order ten bits for the digital representation for the unknown analog signal. The difference between the integrator circuit output at the conclusion of the integration period and the output of the integrator circuit at the beginning of the integration period is calculated by the microprocessor 102. This difference is then combined with the high order ten bits of the digital representation for the unknown analog signal in a manner producing a digital representation of the unknown analog signal having sixteen binary bit positions therefor in a manner described hereinafter in greater detail.

During each successive approximation period during which the output of the integrator circuit remains constant, the microprocessor 102 is controlled by the ROM 104 in a manner such that the latch 140 is first loaded with an eight binary number represented in hexadecimal as 80. This digital number is transmitted over the data lines to the DAC in FIG. 1 which operates in a manner hereinbefore described to produce a level at its output pin 4. As indicated earlier, if the trial value input to the DAC in FIG. 1 is not enough to pull the comparator input pin 3 below zero, the resulting comparator output level causes a high level signal to appear on the comparator out line to the circuitry of FIG. 4. When the microprocessor 102 senses this condition by way of reading the buffer 130, it realizes that the trial bit should remain in the value being developed by successive approximation.

On the other hand, if the binary value 80 to the DAC of FIG. 1 does pull the comparator input below 0 or its switching level, the resulting comparator output level goes low and this is sensed by the microprocessor indicating that the trial number in the latch 142 is too high. Then the trial bit is removed by the microprocessor.

In any event, the microprocessor determines whether the high order bit is or is not part of the final value for the output of the integrator. This bit is then stored for use with each successive approximation of the integrator output. Assume for the moment that the first bit belongs in the first approximation for the integrator output, then the microprocessor loads the latch 142 during its second approximation with a binary C0 and the second highest order bit position is then tested by way of the comparator out line to determine whether it belongs in or out of the approximation being developed. If the comparator out line is high then it belongs in the approximation and if the comparator out is low, it does not.

Assuming that the comparator out signal is low, then the microprocessor 102 recognizes that the second highest order bit position should be a zero and proceeds on to test the next bit position by placing a binary value of A0 into the latch 142. Again, the comparator out line is tested by the microprocessor and the third highest order bit position it is determined to be either a 1 or 0. This process continues until all eight bits of the approximation for the pre-integration period output level for the integrator have been calculated. The value is stored by the microprocessor 102 in a register specified by the control provided by the ROM 104 for later calculation by the microprocessor of the low order bit positions in a digital representation for the unknown analog signal being measured by the converter of the invention.

As indicated earlier, the microprocessor 102 develops a signal at the output of the latch 142 indicating that the circuitry of FIG. 1 should operate to integrate the unknown analog input for a period of six milliseconds. During that period of time, the dump pulses transmitted from the circuitry of FIG. 1 to the counter 132 are counted thereby and by way of carry propagates to the counters 134 and 136, the total number of dump pulses is counted. By reason of the fact that current dumps occurring during the integration period require two microseconds and a new dump can begin one microsecond thereafter, the dump circuitry can be actuated once every three microseconds. Accordingly, a maximum of two thousand dumps can be measured during any given six millisecond integration period.

After the microprocessor 102 has determined that the 6 millisecond integration period is completed, the microprocessor 102 causes the NOT INTEGRATE signal from the latch 142 to change state thereby causing the integrator in the circuit of FIG. 1 to stop. At this point in time, the number of current dumps which occurred during the integration period is indicated by the binary number contained in counters 136, 134, and 132.

After the integrator of FIG. 1 has been stopped by the microprocessor 102, the control provided by the ROM 104 causes the microprocessor 102 to again determine by successive approximation the post integration period output level in the manner described above. Thereafter, the microprocessor 102 calculates the difference between the integrator output as determined by successive approximation prior to the integration period and the integrator output as determined by successive approximation at the conclusion of the inegration period.

After the conclusion of the integration period, the microprocessor 102 initiates a data transfer from the counters 136, 134 and 132 so as to be able to determine the binary value for the number of current dumps which occurred during the integration period. This data transfer is initiated by first placing the address 029F on the address bus which is decoded by the decoder 112 to thereby actuate the buffer 138 and cause the content of the counter 136 to be gated onto the data bus and thereby read into the microprocessor 102. Subsequently, the microprocessor places address 027F on the address bus which causes the counter 136 to be loaded with the content of counter 134. Then, by placing address 026F on the address bus, the counter 134 is loaded with the data in the counter 132. In a similar manner, by subsequently placing the address 025F on the address bus, the counter 132 is loaded with all zeros because all its load inputs are all grounded.

Thereafter, the microprocessor 102 places the address 029F on the address bus again thereby causing the content of counter 136 to be placed on the data bus 106. It should be recalled, however, that since the counter 136 now contains the data originally appearing in counter 134, the second four bits of the binary number representative of the number current dumps is thereby transmitted to the microprocessor 102. Thereafter, in a manner just described, the content of counter 134 is again shifted into counter 136 and the content of counter 132 is shifted into counter 134. Accordingly, the lowest order 4 bits of the current dump count now resides in counter 136 and counters 134 and 132 are cleared.

The microprocessor 102 again places the address 029F onto the address bus thereby causing the data in counter 136 to be placed on the data bus 106. In this manner, the lowest order four bits of the current dump count is transmitted to the microprocessor. Thereafter, the counter 136 is cleared by placing the address 027F on the address bus which causes the zeros now residing in counter 134 to be placed into counter 136.

Once the current dump count and the difference between the integrator output prior to and following the integration period is available in the microprocessor, these binary numbers are combined in the manner specified by the data shown in FIG. 5 which resides in the ROM 104 to produce a sixteen bit binary number which corresponds to the digital representation for the unknown analog signal appearing at the input to the circuitry in FIG. 1.

It can be shown that whenever the difference between the integrator output after and before the integration period is an eight bit binary number with its highest order bit a 1, then the difference is negative, i.e., the value of the integrator output after the integration period is less than the integrator output before the integration period. Where the high order bit of the difference between the two numbers developed by successive approximation is a zero, then the difference is positive, i.e., the value of the integrator output after the integration period is greater than the integrator output before the integration period.

The sixteen bit number representative of the decimal value for the unknown analog input is generated as shown in the following example. First, assume the number of charge dumps occurring during the integration period is 2AA in hexadecimal or 001010101010 in binary and the difference between the inegrator output before and after the integration period is AA in hexadeimal of 10101010 in binary. Since the difference is AA and the highest order bit thereof is a 1, the difference is negative as noted above. In this case the dump count must be decreased by 1 to 2A9. Then, the second through the eighth bits of the difference are added to the decreased count to form the binary number 0010101010010101010 which is a 19 bit number. Since the lowest order bit is of least significance, it can be discarded to arrive at an eighteen bit number. Also, as already noted, the two highest order bits of the charge dump count are always zero, they can be discarded leaving a 16 bit number which can conveniently be represented by four hexadecimal characters as AA55 or 1010101001010101 in binary.

When the difference in the integrator output level before and after the integration period is 2A or 00101010, the difference is positive so it can simply be added to the low end of the charge dump count after the high order 0 has been discarded. Assuming the charge dump count is 2AA, the resulting combined number representing the analog input in binary is 00101010101000101010. Discarding the 2 high order bits and the low order bit, the 16 bit number representation for the analog input is 1010101010010101 in binary of AA95 in hexadecimal.

The microprocessor 102 thereafter converts the sixteen bit binary number into driver signals for turning on the appropriate segments of a seven segment display utilized for displaying four bit segments (nibbles) of the sixteen bit binary number representative of the digital value for the analog input to the system. On converting each of the four bit segments, the data representative of the high order four bits is transmitted by the microprocessor by way of the data bus 106 to the latch 160 by placing the data on the data bus 106 and the address 02CF on the address bus. The data representative of the second most significant four bits is transmitted to the latch 162 by placing the address 02DF on the address bus and the data on the data bus 106. The data representative of the third highest order 4 binary bits of the digital representation for the unknown analog input is transmitted over the data bus 106 to latch 164 when the address 02EF is placed on the address bus. In like manner, the lowest order digital information is transmitted over the data bus 106 to latch 166 by placing the address 02FF on the address bus. Accordingly, the latches 160, 162, 164 and 166 contain information for driving respectively the seven segment displays 170, 172, 174 and 176 so that the latter displays will present, in a human readable form, a hexadecimal representation for the digital value for the unknown analog input.

Those of skill in the art will recognize, however, that a binary to decimal converter could be utilized to convert the binary data residing in the microprocessor 102 which represents the digital value for the unknown analog input into the proper signals for driving a display such as a seven segment display so as to provide a representation in decimal for the unknown analog input. Likewise, the binary itself could be displayed directly by placing the sixteen bit binary number into a latch containing sixteen bit positions and having each bit position drive, for example, a light emitting diode. Other possible display arrangements will readily occur to those of skill in the art.

Those of skill in the art will observe throughout the drawings described above that circuit components have been assigned parameter values or standard commercial designations. This is done purely for clarity and reader convenience and is not intended as a limitation on component value or type nor as a restriction on the scope of the invention. It will be further observed that the control as established by the content of the ROM 104 as defined in FIG. 5 is merely provided as an example of how the described functions might be accomplished. Those of skill in the art can readily modify that control function or design a new content for the ROM 104 which will achieve the same objective although its representation will be different from that described in FIG. 5. As has already has been noted, the content of the ROM 104 as defined by FIG. 5 is representative of the control function for an analog to digital converter which operates continuously. That content must be modified somewhat in a manner understood by those of skill in the art so as to permit the analog to digital converter of the present invention to provide measurements of the unknown analog input signal in response to an external trigger mechanism such as a mechanical chopper of a spectrophotometer.

Those of skill in the art will readily recognize that the foregoing and other modifications to the preferred embodiment of the invention as described above can be made without departing from the spirit and scope of the invention as defined in the claims.

What is claimed is:

1. A high resolution analog to digital converter circuit for measuring the level from an unknown analog source comprising, in combination:
    an integrator circuit coupled to the unknown source for producing an integral signal at its output whose magnitude is the integral of the analog signal provided by the unknown source;
    actuator means coupled to said integrator to actuate said integrator circuit for producing said integral signal for a fixed period of time;
    comparator circuit coupled to compare said integral signal with a preset level and to produce a compare signal when said integral signal equals said preset level;
    reverse polarity dump circuit means coupled to said integrator circuit and responsive to said compare signal to introduce to the input of said integrator for a preset time a constant signal of opposite polarity to that from the unknown analog source;
    counter means responsive to said compare signal to count the occurrences of said compare signal while said integrator circuit is actuated; and
    interpolar circuit means operative just preceeding actuation of said integrator circuit to produce a digital beginning representation corresponding to the level of the output of said integrator circuit prior to its actuation and operative just after said fixed period of time has elapsed to produce a digital ending representation corresponding to the level of the output of said integrator circuit, the number in said counter means and the difference between said beginning and said ending representation comprising data for determining a digital representation of the unknown signal.

2. The analog to digital converter circuit of claim 1 additionally including means to take the difference between said beginning representation and said ending representation, said difference comprising a data representation related to the low order digits of the digital representation for the unknown analog source level.

3. The high resolution analog to digital converter circuit of claim 1 wherein said interpolator circuit means includes a digital to analog converter for producing an analog signal in response to a binary number, said analog signal being applied to the output of said integrator circuit; and
    a digital number calculating means for producing said binary number, said calculating means first producing a binary number with only the most significant bit being present, said calculating means responding to said comparator circuit if said analog signal is greater in magnitude than said integrator circuit output to change said most significant bit and responding to said comparator circuit if said analog signal is less than the magnitude of said integrator circuit output to leave said most significant bit unchanged, said calculating means being operative to test successively lower significant bit positions of said binary number in the same manner until a binary number is formed which is representative of the magnitude of said integrator circuit output.

4. The high resolution analog to digital converter circuit of claim 1 wherein said interpolator circuit means includes a binary number register;
    a digital to analog converter responsive to said binary number register to produce an analog signal whose magnitude is proportional to the number in said binary number register, said analog signal being coupled to the output of said integrator circuit;
    a microcomputer coupled to said binary number register and to said comparator circuit for producing, by successive approximation, a binary number for placing in said binary number register, said binary number after each successive approximation becoming closer to a value correlated to the magnitude of said integrator circuit output.

5. A high resolution analog to digital converter for measuring the level of an unknown analog signal comprising, in combination:
    an actuatable integrator circuit coupled to the unknown analog signal for producing an integral signal at its output while said integrator is actuated;
    actuator means to actuate said integrator circuit for a selectable period of time;
    comparator circuit coupled to the output of said integrator circuit to produce a compare signal wherever the output of said integrator circuit exceeds a preselected value;
    a dump circuit coupled to said integrator circuit and responsive to said compare signal to cause the output of said integrator circuit to change by a fixed amount so that said integrator circuit output no longer exceeds said preselected value;

counter means to count the number of occurrences of said compare signal during said selectable period of time;

a successive approximation circuit operative just prior to the beginning of said selectable period and just after the conclusion of said selectable period to produce respectively a pre-integration period output level indication and a post integration period output level indication;

difference means to produce a difference indication corresponding to the difference between said post integration period output level and said pre-integration period output level; and means to combine said difference indication and the count in said counter means to produce a digital representation for the unknown analog signal.

6. The high resolution analog to digital converter of claim 5 additionally including display circuit means responsive to said digital representation for producing a humanly perceptable representation of said digital representation.

7. A method of operating a high resolution analog to digital converter comprising the steps of:

measuring the output of an actuatable integrator circuit, prior to its being actuated, the integrator input being coupled to an unknown analog input signal when it is actuated;

actuating the integrator for a selectable period of time in response to the unknown analog input;

monitoring the output of the integrator during the selectable period in which the integrator is actuated and producing a compare signal when the integrator output is at least as high as a preselected level;

forcing the integrator output down by a selected amount during the selectable period in which the integrator is actuated in response to the compare signal so the integrator output is below said preselected level;

counting the number of compare signals during said selectable period of time;

measuring the output of the actuatable integrator at the conclusion of said selected period of time; and combining both said measurements and said compare signal count to produce a digital representation of the unknown analog input signal.

8. The method of claim 7 wherein said combining step includes determining the difference between said measurement made after said selectable period and said measurement made before said selectable period begins.

* * * * *

UNITED STATES PATENT AND TRADEMARK OFFICE
CERTIFICATE OF CORRECTION

PATENT NO. : 4,320,390
DATED : March 16, 1982
INVENTOR(S) : Larkin B. Scott

It is certified that error appears in the above-identified patent and that said Letters Patent are hereby corrected as shown below:

Column 3, line 49, delete "wich" and insert --which--.

Column 5, lines 10 and 11, "al-ready" should read -- desirably --.

Column 8, line 45, after the word "input" insert --thereto.--.

Column 11, line 14, delete "inegration" and insert --integration--.

Signed and Sealed this

Twelfth Day of February 1985

[SEAL]

Attest:

DONALD J. QUIGG

Attesting Officer     Acting Commissioner of Patents and Trademarks